United States Patent [19]

Hamzawi

[11] 4,105,476
[45] Aug. 8, 1978

[54] METHOD OF MANUFACTURING SEMICONDUCTORS

[75] Inventor: Fawzi J. Hamzawi, Riviera Beach, Fla.

[73] Assignee: Solitron Devices, Inc., Tappan, N.Y.

[21] Appl. No.: 793,190

[22] Filed: May 2, 1977

[51] Int. Cl.² .................................... H01L 21/225
[52] U.S. Cl. .................................... 148/187; 148/188
[58] Field of Search .................................... 148/187, 188

[56] References Cited

U.S. PATENT DOCUMENTS

| 3,255,056 | 6/1966 | Flatley et al. ................... 148/187 |
| 3,309,246 | 3/1967 | Haenichen ........................ 148/187 |
| 3,330,030 | 7/1967 | Broussard ..................... 148/187 UX |
| 3,574,009 | 4/1971 | Chizinsky et al. ................ 148/187 |

*Primary Examiner*—M. J. Andrews
*Attorney, Agent, or Firm*—Richard G. Geib

[57] ABSTRACT

Method of fabricating a high voltage ($V_{CED} = 800$ volts) PNP Power Transistor by a triple diffusion technique.

1 Claim, 2 Drawing Figures

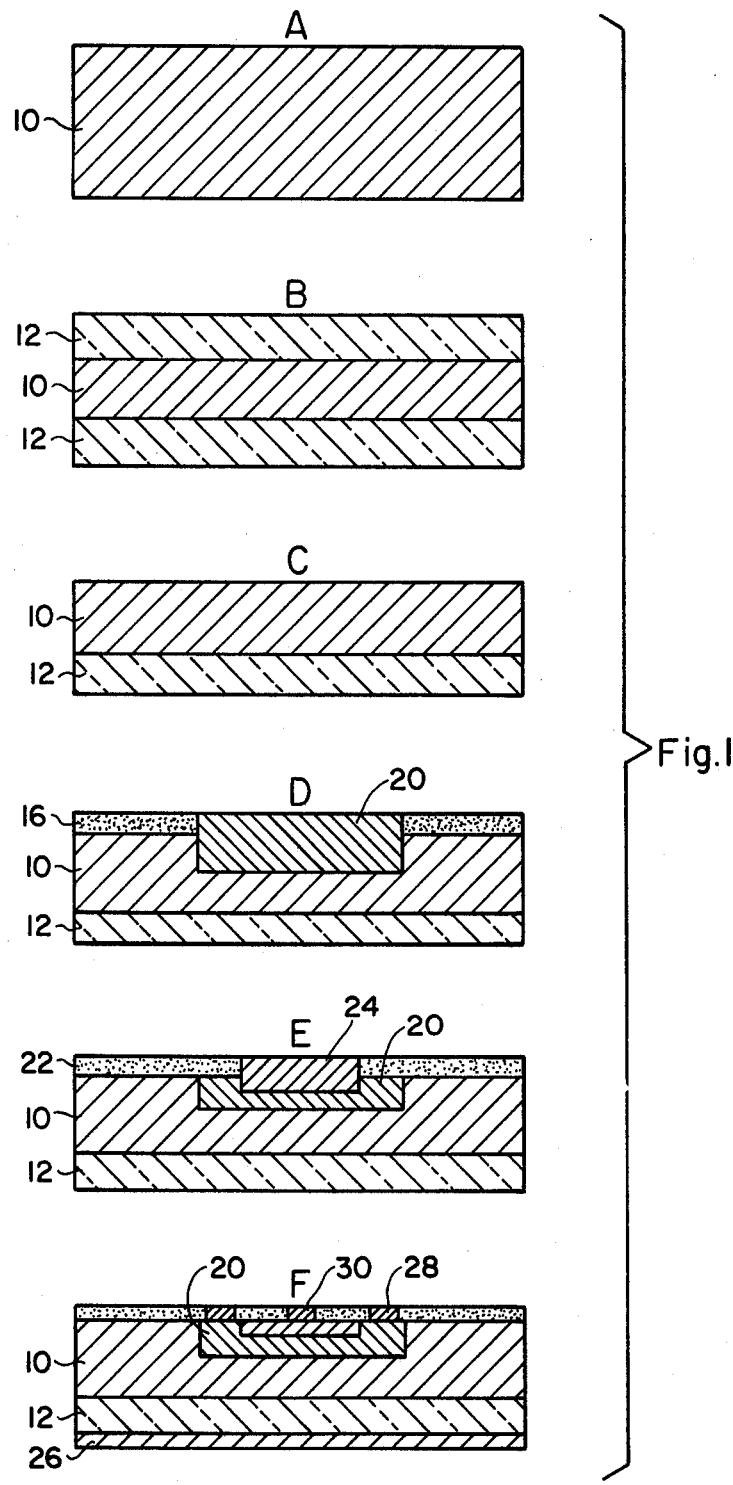

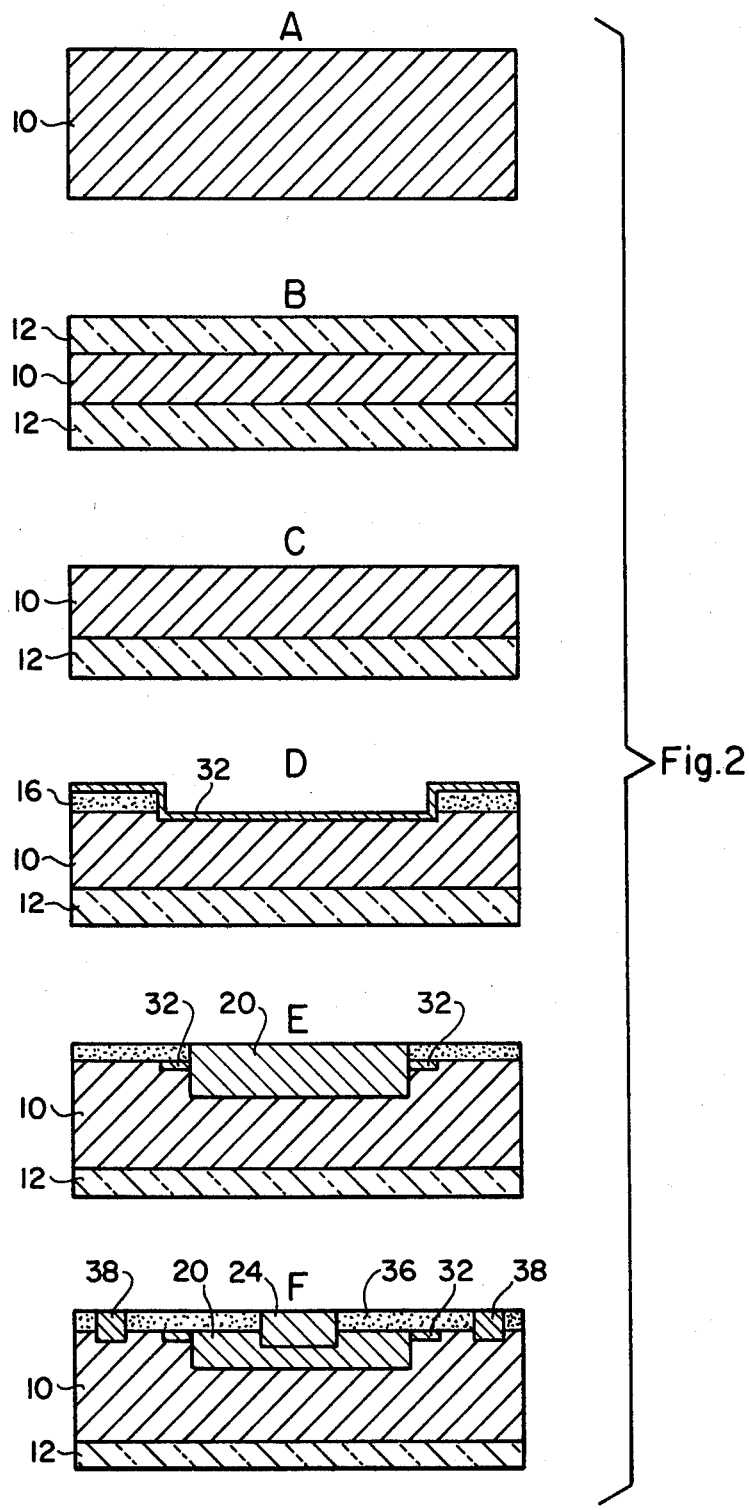

METHOD OF MANUFACTURING SEMICONDUCTORS

BACKGROUND

A particular use of the method of this invention is in the fabrication of PNP devices. Prior art structures of this type obtain such a semiconductor using epitaxial techniques and as a result the semiconductor has been only practical of use for NPN low voltage structures. Such structures have been noted by way of U.S. Patents as exemplified by U.S. Pat. Nos. 3,226,611; 3,226,612; 3,226,613; and 3,309,245. This invention improves the art by introducing triple diffusion processes to PNP semiconductors capable of high voltage usage, i.e. $V_{CBO}$ = 800 volts.

The epitaxial process in so far as can be known will not provide a high resistivity P− material to enable one to manufacture high voltage devices therefrom. Prior attempts to obtain such structure for such devices has not been noted to be successful in that it has been heretofore difficult to obtain high concentration (P+) doping for a P type body of silicon. It is believed these difficulties are due to the formation of a thick glass of the impurity cooled at a different rate from the silicon and the resultant breakage of the silicon wafer (dice). Also, heretofore, it has not been easy to lap the surface without damaging the wafer. Some have sought to avoid all this by removing the glass at deposition. However, such leads to low concentration of P+ doping in the body. In addressing these problems this invention is singularly significant in advancing the art of semiconductor manufacture.

DRAWING DESCRIPTION

FIG. 1 shows the steps in preparation of a triple diffused semiconductor according to this invention; and FIG. 2 shows part of the steps of FIG. 1 with variations for a higher voltage semiconductor.

DETAILED DESCRIPTION

With more particular reference to FIG. 1 there is shown first a P type semiconductor body 10 which has had deposited thereon a P+ dopant, such as Boron, to form a P+ layer 12. Actually the dopant layer 12 is preferably formed by passing body 10 through a furnace so that it is held at a temperature of 1050° C for 4 hours in a diborane ($B_2H_6$) atmosphere so as to deposit the P+ layer into both sides of the wafer (dice) 10 shown as a glassy surface layer.

At the conclusion of this step the wafer 10 with its glassy layer is passed through a furnace hoding it a temperature of 1200° C for 2 hours to drive the impurity into wafer 10.

Next the structure is, upon cooling gradually so as to avoid thermal gradients between the body and the glass layer, whereupon the wafer may have on one surface stripped of the glass as by an appropriate chemical strippant.

Thereafter the wafer with its P+ boundry is again passed through a furnace at 1275° C over a period of 48 hours. This creates a body having a P+ depth of approximately 4 mils with a sheet resistivity of 0.072 $\Omega/\square$, i.e. a doping concentration of $1.5 \times 10^{20}$ cm $^{-3}$.

Next the P+ layer on one side of the wafer is lapped completely away and then the surface is polished chemo-mechanically, leaving a P+ layer 12 for other side of the wafer which will be the collector of the transistor.

Thereafter an oxide layer 16 is formed, top layer shown, and it is opened and a low concentration base impurity. i.e. phosphor, is deposited therewithin and subsequently or simultaneously diffused into body 10 to form a base 20. Next an oxide layer 22 is formed and opened for the deposit of a boron impurity to provide an emitter area 24. The base concentration in a preferred form was $2.2 \times 10^{16}$ cm$^{-3}$ and the emitter was $4.3 \times 10^{19}$ cm$^{-3}$.

Finally as by known techniques contacts 26, 28 and 30 were affixed to the collector 12, base 20 and emitter 24.

As can be seen by FIG. 2 steps A through C of FIG. 1 are repeated in processing still another device. However, before proceeding to step D it is desired to provide first an N-guard ring 32 adjacent the base but of an impurity concentration much less than the concentration of the base. Both the guard ring and the base are diffused simultaneously, as shown by FIG. 2, step E.

Next, step F is accomplished by using reformed oxide layer 36 as a mask through windows of which P guard ring 38 of similar high concentrate as emitter 24 is formed spaced from guard ring 32.

Having described the process of this invention it may be claimed as now is to be set forth.

I claim:

1. In the manufacture of a semiconductive device the steps of:

exposing a silicon wafer of P type conductivity to a diborane impurity atmosphere by passing the wafer through a furnace containing such atmosphere at a temperature of 1050° C over a 4 hour period to deposit said diborane impurity about said wafer as a glassy layer;

passing said wafer through a furnace after depositing said diborane impurity for a period of two more hours while raising its temperature to and holding it thereat 1200° C to diffuse the diborane impurity into the wafer;

cooling the wafer gradually to avoid thermal gradients between the glassy layer and the wafer;

stripping the glassy layer from one surface;

passing the wafer after the stripping through a furnace to heat it to and hold it at 1275° C for a period of 48 hours to provide a P+ depth of approximately 4 mils in from the other surface of the wafer;

lapping the one surface;

chemo-mechanically polishing the other surface to leave a P+ surface; and using oxide masking to provide other areas of impurity concentration for the semiconductive device and appropriate contacts therewith.

\* \* \* \* \*